United States Patent
Furukawa et al.

(10) Patent No.: US 6,489,207 B2
(45) Date of Patent: Dec. 3, 2002

(54) METHOD OF DOPING A GATE AND CREATING A VERY SHALLOW SOURCE/DRAIN EXTENSION AND RESULTING SEMICONDUCTOR

(75) Inventors: Toshiharu Furukawa, Essex Junction, VT (US); Mark C. Hakey, Milton, VT (US); Steven J. Holmes, Milton, VT (US); David V. Horak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/871,926

(22) Filed: Jun. 1, 2001

(65) Prior Publication Data

US 2002/0022354 A1 Feb. 21, 2002

Related U.S. Application Data

(62) Division of application No. 09/071,704, filed on May 1, 1998.

(51) Int. Cl.$^7$ ............................................. H01L 21/336
(52) U.S. Cl. .................. 438/301; 438/305; 438/303; 438/595
(58) Field of Search ......................... 438/586, 510, 438/197, 301, 305

(56) References Cited

U.S. PATENT DOCUMENTS

| | | | |
|---|---|---|---|
| 4,566,937 A | 1/1986 | Pitts | |
| 4,861,729 A | 8/1989 | Fuse et al. | |
| 4,916,090 A | 4/1990 | Motai et al. | |
| 5,146,291 A | 9/1992 | Watabe et al. | |
| 5,561,072 A | 10/1996 | Saito | |
| 5,569,615 A | 10/1996 | Yamazaki et al. | |
| 5,599,735 A | 2/1997 | Moslehi | |
| 5,770,490 A | 6/1998 | Frenette et al. | |
| 5,994,175 A | 11/1999 | Gardner et al. | |
| 6,159,814 A | * 12/2000 | Gardner et al. | ............. 438/305 |
| 6,287,925 B1 | * 9/2001 | Yu | ............................. 438/301 |

FOREIGN PATENT DOCUMENTS

| JP | 2-44717 | 2/1990 |
|---|---|---|
| JP | 2-66938 | 3/1990 |

OTHER PUBLICATIONS

Wolf "Silicon Processing for the VLSI Era" vol. 1, pp. 264–265, 280–281, 325–327, 1986.

Ghandhi "VLSI Fabrication Principles", pp. 160–163, 591–593, 1983.

* cited by examiner

Primary Examiner—David Nelms
Assistant Examiner—Thao P Le
(74) Attorney, Agent, or Firm—Schmeiser, Olsen & Watts; Mark F. Chadurjian

(57) ABSTRACT

The present invention relates to a method of forming a very shallow source-drain (S/D) extension while simultaneously highly doping a very narrow polysilicon gate through to the gate dielectric interface. The invention also relates to the resulting semiconductor.

9 Claims, 8 Drawing Sheets

METHOD OF DOPING A GATE AND CREATING A VERY SHALLOW SOURCE/DRAIN EXTENSION AND RESULTING SEMICONDUCTOR

This application is a divisional of Ser. No. 09/071,704, filed on May 1, 1998.

BACKGROUND OF THE INVENTION

1. Technical Field

The present invention relates generally to methods of fabricating semiconductor wafers. More particularly, the present invention relates to a method of forming a very shallow source-drain (S/D) extension while simultaneously doping a very narrow polysilicon gate. The present invention also includes the resulting semiconductor.

2. Related Art

Heretofore, demand for higher performance chips have driven Metal Oxide Semiconductor Field Effect Transistors (MOSFET) to shorter channel length for higher current. This high performance requires a shallow source-drain (S/D) extension and highly doped polysilicon gates completely through to the gate dielectric interface. However, as polysilicon width becomes narrower, with the aspect ratio close to 1, optimum doping of the polysilicon gate by conventional ion implantation after gate definition etching becomes very difficult.

As a result, there exists a need to have processes of fabrication in which highly doped polysilicon gates can be created with very shallow S/D extensions.

SUMMARY OF THE INVENTION

The present invention is a method of providing a layer (e.g., a substrate) including at least one polysilicon gate and at least one source/drain region; and simultaneously doping at least one gate stack and the source-drain regions. As a result, very shallow S/D extensions (i.e., less than $0.1\mu$) can be created without extra lateral scattering of dopant while at the same time providing a narrow (i.e., less than $0.2\mu$), highly doped polysilicon gate (i.e., greater than $10^{19}$ atoms of dopant/cm$^3$) completely through to the gate dielectric interface.

The present invention also includes the resulting semiconductor exhibiting the very shallow S/D extensions and the highly doped polysilicon gate through to the gate dielectric interface.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although certain preferred embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of the preferred embodiments. In particular, the present invention has been disclosed for use in high performance logic technology. However, the present invention can also be used to dope gates and S/D extensions of a high density Non-Volatile Random Access Memory (NVRAM) device or other devices.

Figure 1:
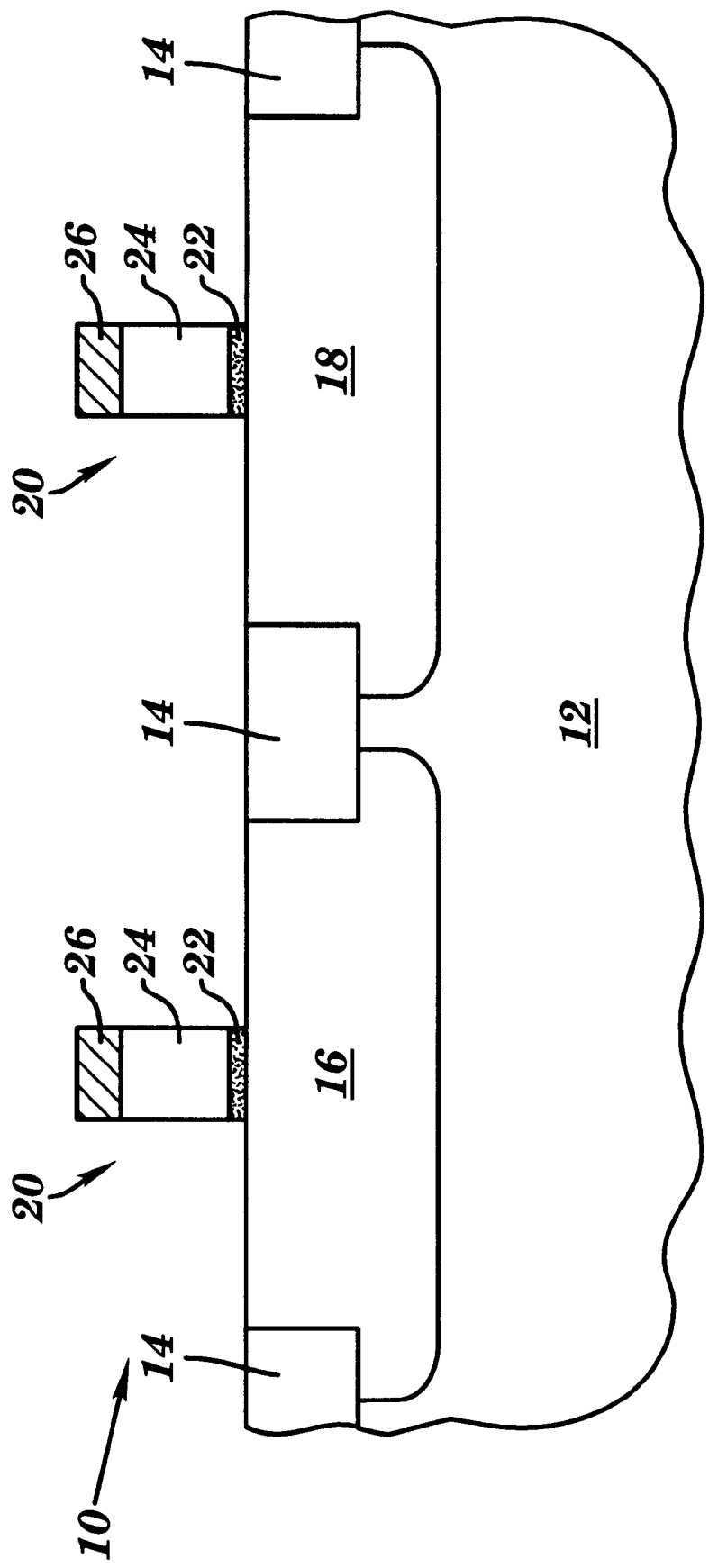
FIG. 1 shows a semiconductor wafer prior to doping in accordance with the present invention.

FIG. 1 is a cross-sectional view of a high performance Complementary Metal-Oxide Semiconductor (CMOS) device 10 after device isolation formation, N-well and P-well formation and gate stack formation in accordance with conventional techniques but prior to doping in accordance with the present invention. The device generally includes at this point of the manufacturing process: a silicon layer or substrate 12 having located in a surface thereof a plurality of shallow trench isolations (STI) 14, e.g., $0.3\mu$–$0.4\mu$ deep. The wells 16, 18 of the device 10 are located between the isolation trenches 14. The device includes a P-well 16 and an N-well 18.

The polysilicon gate stacks 20 are also present at this juncture of manufacturing. The gate stacks 20 generally include a gate dielectric layer 22, e.g., silicon dioxide, and a polysilicon body or gate 24 over the wells 16, 18. On an upper surface of the polysilicon gates 24, a layer of gate wiring material 26 may also be provided prior to gate stack etching to replace the need to form titanium salicide later. This wiring material can be any highly conductive material, e.g., tungsten (W) or tungsten silicide (WSi$_x$).

At this juncture, in accordance with the present invention, the polysilicon gates 24 are doped simultaneously with the source/drain (SID) regions.

Figure 2:
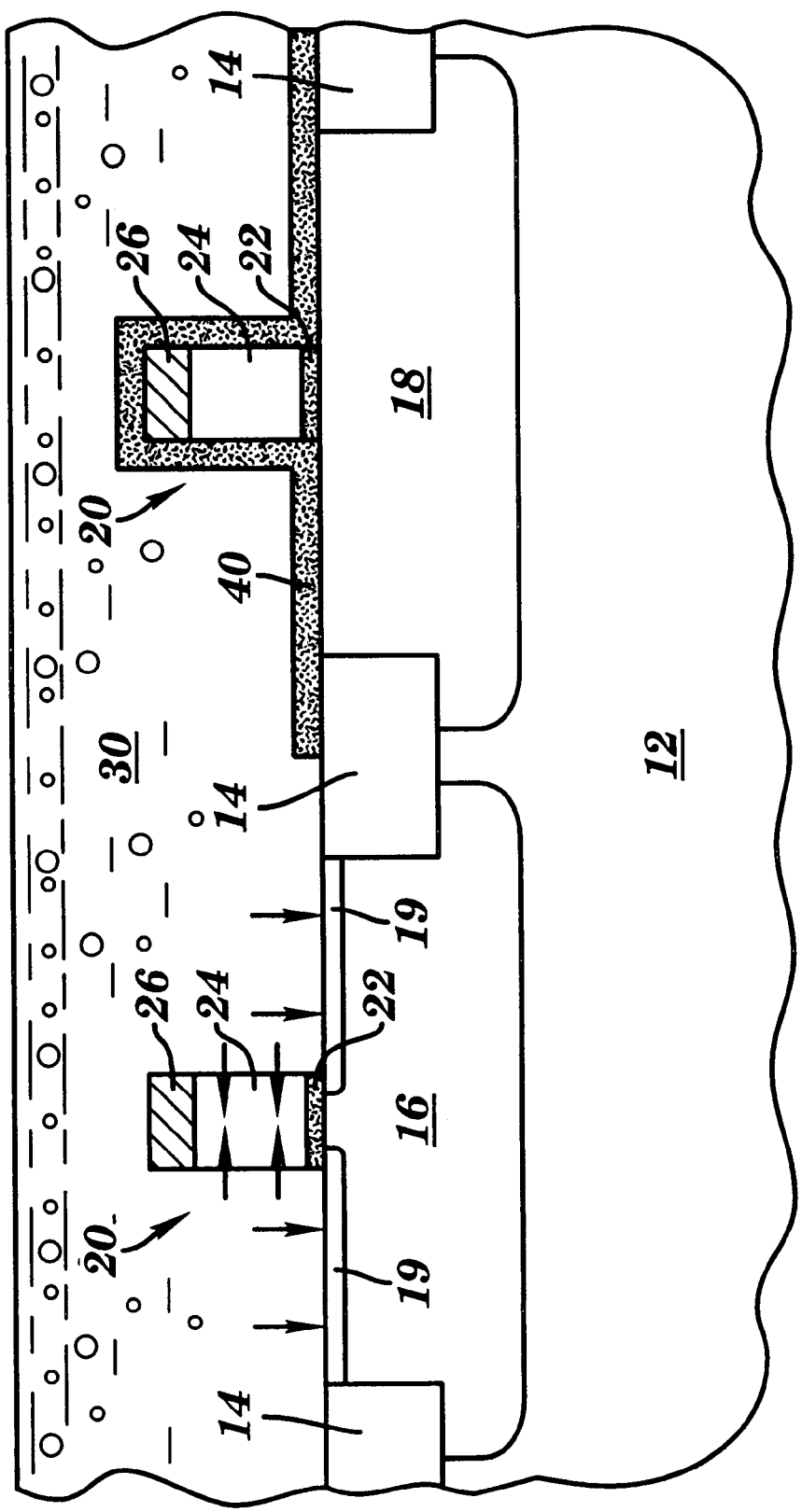
FIG. 2 shows a method of doping in accordance with a first embodiment of the present invention.

As shown in FIG. 2, in a first embodiment of the present invention, gas phase doping is selectively used to provide simultaneous doping of polysilicon gates and SID regions. In particular in this embodiment, the gate stack 20 and well 18 that are not going to be doped are covered by an appropriate diffusion preventing material 40. This diffusion preventing material 40 may be deposited by a variety of methods such as chemical vapor deposition (CVD), vapor deposition or sputtering. Further, the diffusion preventing material 40 can take a variety of forms. For instance, silicon nitride or silicon dioxide may be used depending on the progression of the process. Next, in order to dope the unmasked region, the S/D regions 19 and polysilicon gate 24 are exposed to a gaseous (or plasma) doping source 30 of a chosen type, i.e., n-type or p-type, while the entire device 10 is heated to a temperature greater than 800° C. depending on the dopant used. This gas may take a variety of forms depending on the desired type of doping, i.e., p-type or n-type. For instance, arsenic trichloride ($AsCl_3$), arsenic triflouride ($AsF_3$), phosphine ($PH_3$), phosphorous trichloride ($PCl_3$), phosphorous triflouride ($PF_3$) and arsine ($AsH_3$) have been used with success as n-type gaseous dopants.

Generally, heating is provided by furnace heating. However, as an alternative, only the region where the doping is made may be heated. This alternative may be provided while the wafer is exposed to the gaseous (or plasma) doping source 30, for example, by either a masked laser beam (not shown) or a rapid thermal anneal-type lamp (not shown). Of note, if a masked laser beam is used, the diffusion preventing material 40 may not be needed.

Next, the diffusion preventing material 40 is removed and the process repeated for the remaining gate stacks 20 and S/D regions 19 using the opposite type doping source, i.e., p-type or n-type, depending on the first used doping source. Examples of p-type dopants that have been used are: diborane ($B_2H_6$), boro trichloride ($BCl_3$), and boro triflouride ($BFF_3$).

The above described method provides a narrow polysilicon gate, i.e., less than $0.2\mu$, that is doped from the sidewalls to ensure high doping of the polysilicon gate body 24 through to the gate dielectric interface, i.e., where the gate body 24 and dielectric layer 22 meet. Shallow S/D extension doping in the range of less than $0.1\mu$ deep is also achieved without extra lateral scattering of dopant experienced in doping by an ion implantation.

Figure 3:
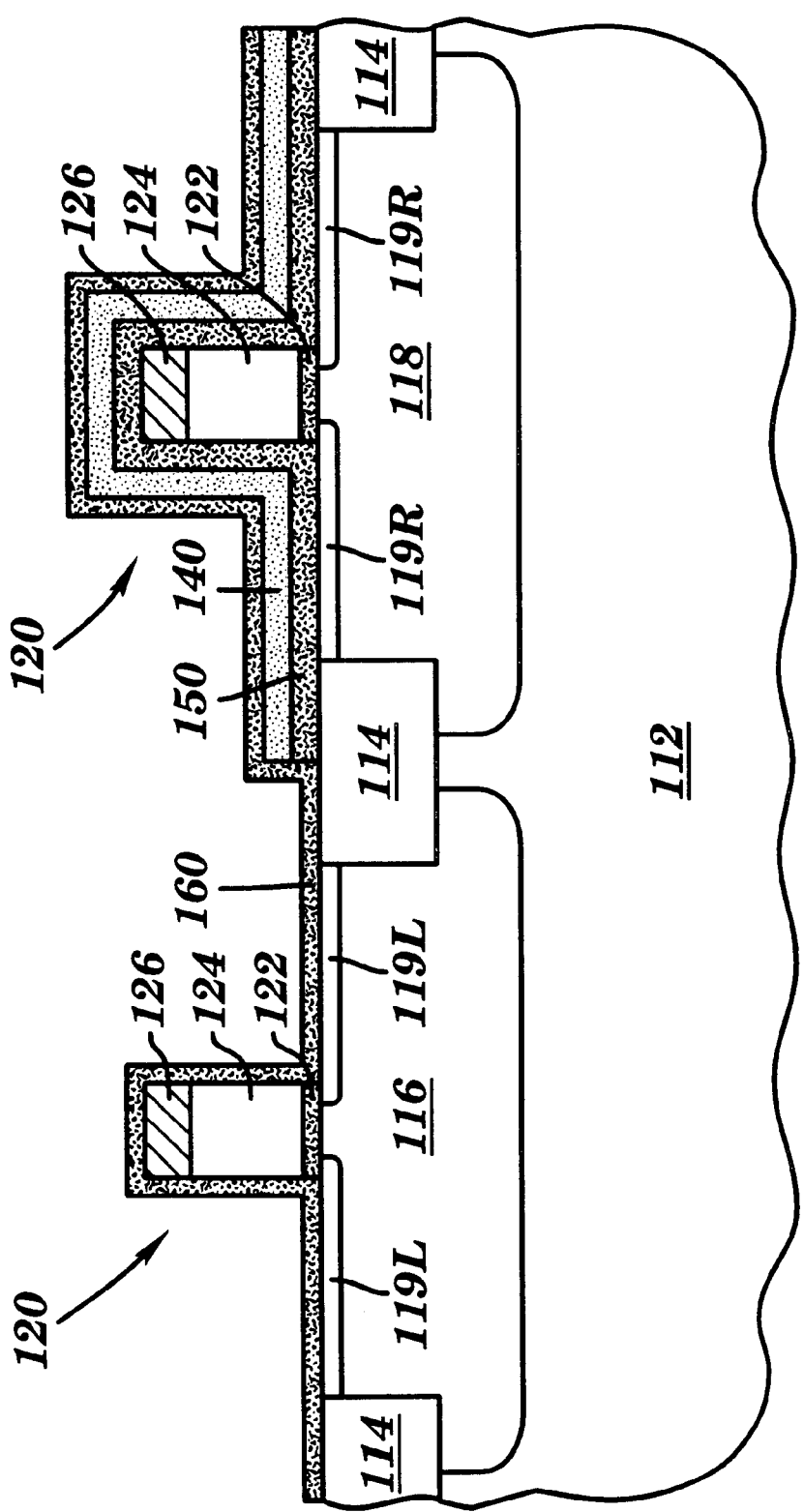
FIG. 3 shows a method of doping in accordance with a second embodiment of the present invention.

A second embodiment of the present invention involves the use of solid phase doping. In this embodiment, as illustrated in FIG. 3, a first type dopant source material 150 is first deposited, for instance by chemical vapor deposition (CVD), over a gate stack 120 and associated SID region. This first type dopant material 150 may take a variety of forms. For example, boron doped silicate glass (BSG) may be used as a p-type dopant material. Next a thin diffusion preventing material 140 is deposited. Again, this diffusion preventing material 140 may take a variety of forms, for example, silicon nitride or silicon dioxide.

The first type dopant material 150 and diffusion preventing material 140 are then patterned (e.g., by applying a photoresist (not shown), exposing, developing and etching) so that the first type dopant material 150 is contacting only the SID region and polysilicon gate 124 over the chosen well area, e.g., the n-well area 118. Next, a second type dopant source material 160, e.g., arsenic doped silicate glass (ASG) as an n-type dopant, is deposited over the entire device.

The device is then heated to drive the dopants from the two dopant source materials 150, 160 to the polysilicon and S/D regions. Alternatively, the order of the doping area, i.e., p-well or n-well, may be switched. In particular, the first type dopant material 150 may be an n-type doping source material and a diffusion preventing layer 140 may be deposited and patterned so that the n-type dopant material 150 is contacting only the S/D region and gate stack 120 over the p-well area 116. Further, the n-type dopant may be driven-in before a second p-type doping source material is deposited. P-type doping source material would then be deposited and the dopant driven-in. By this method, the junction depth can be controlled to be approximately the same for both doping types. Again, the result is a very shallow S/D extension and a highly doped polysilicon gate, i.e., greater than $10^{19}$ atoms of dopant/$cm^3$, completely through to the gate dielectric interface.

Figure 4:
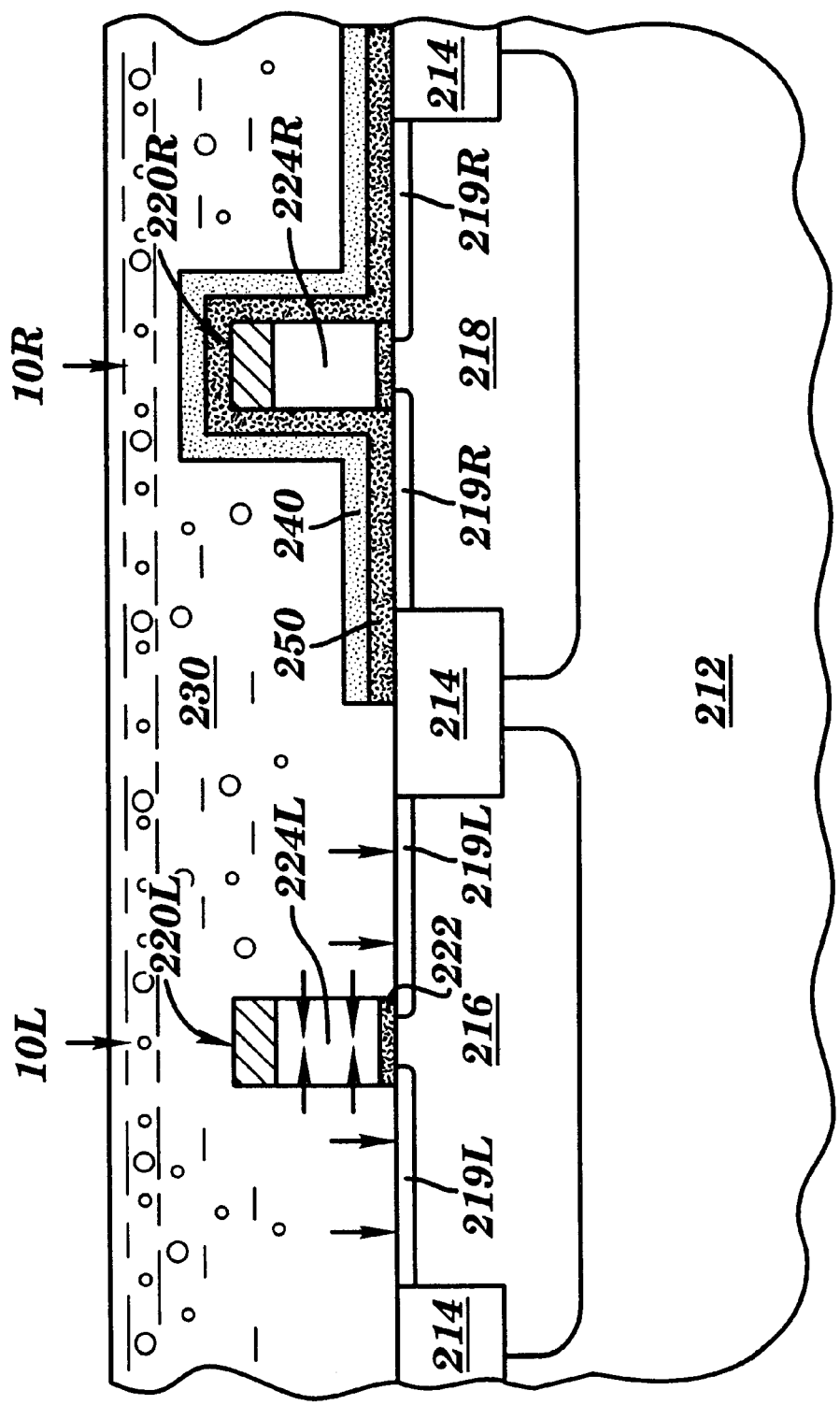
FIG. 4 shows a method of doping in accordance with a third embodiment of the present invention.

In a third embodiment of the present invention, a combination of solid phase doping and gas (or plasma) phase doping is provided. As illustrated in FIG. 4, a first area 10R, including a first S/D region 219R and a polysilicon gate 224R, is doped from a solid doping source 250 with a covering of diffusion preventing material 240. In particular, a first type dopant source material 250, such as BSG as a p-type dopant, and a thin diffusion preventing material 240, such as silicon nitride or silicon dioxide, are deposited, patterned, and etched so that the first type dopant material 250 is contacting only the S/D region 219R and the polysilicon gate stack 220R over the selected well 218 of the first area 10R.

Simultaneously, a second area 10L including a second S/D region 219L and polysilicon gate 224L are doped from a gas (or plasma) phase 230 with the layer of diffusion preventing material 240 masking the first area 10R. The device is then heated to a temperature greater than 800° C. while the S/D region 219L and the polysilicon gate stack 220L over the second area 10L is exposed to the gas phase 230 such as Arsine ($AsH_3$). Again, as an alternative, the order of the type of doping area, i.e., p-well or n-well, may be switched. That is, an n-type doping source material, e.g., ASG, and diffusion preventing material 240, e.g., silicon dioxide, may be deposited and patterned so that the n-type dopant material 250 is contacting only the SID region 219L and polysilicon gate stack 220L over the p-well area 216. Further, the n-type dopant may be driven-in before p-type doping is carried out by the gas phase doping. Once again, the junction depths of both type dopants can be controlled to be approximately the same by this method, and the resulting semiconductor exhibits a highly doped polysilicon gate 224L, i.e., greater than $10^{19}$ atoms of dopant/$cm^3$, completely through to the gate dielectric 222 interface and very shallow S/D extensions, i.e., less than $0.1\mu$.

Figure 5:
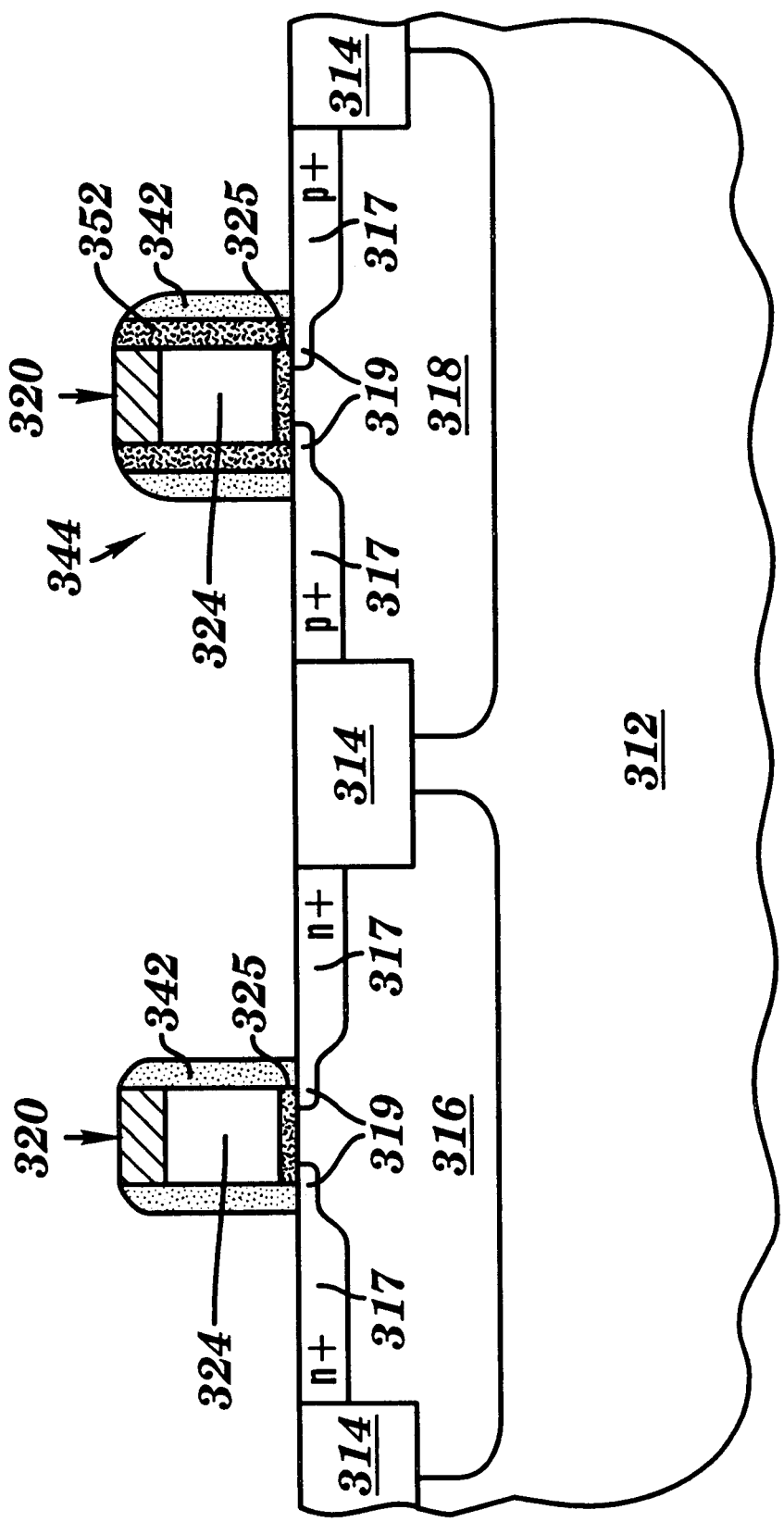
FIG. 5 shows a structure after forming deep S/D diffusions in accordance with an alternative step of the present invention.

As a result of the above embodiments of the present invention, deep source/drain diffusion doping, i.e., greater than $0.1\mu$, is more easily facilitated. In particular, as shown in FIG. 5, after the narrow polysilicon gate 324 and the S/D extensions 319 are doped, spacer forming material 342, such as silicon dioxide or silicon nitride, may be deposited and etched to form the gate spacer 344. If solid doping source material is used, the doping source material, such as BSG 352, may be used to form a part of the spacer 344 as shown in FIG. 5.

Next, N+ or P+ ion implantation is performed with a blocking mask (not shown) covering the opposite type doping area to form deep SID diffusions 317, adjacent the shallower S/D diffusions 319. Wider polysilicon gates (not shown) are also doped by this implantation. Dopants in this phase are activated by heating either by rapid thermal anneal (RTA) or conventional furnaces. The spacers are used to keep the deep S/D diffusion 317 sufficiently away from the device gate edges 325 in order to minimize the short channel effects. The deep S/D diffusion 317 is needed to form silicide over the diffusion area without severe junction leakage and also to form diffusion contact without shorting to the well.

Figure 6:
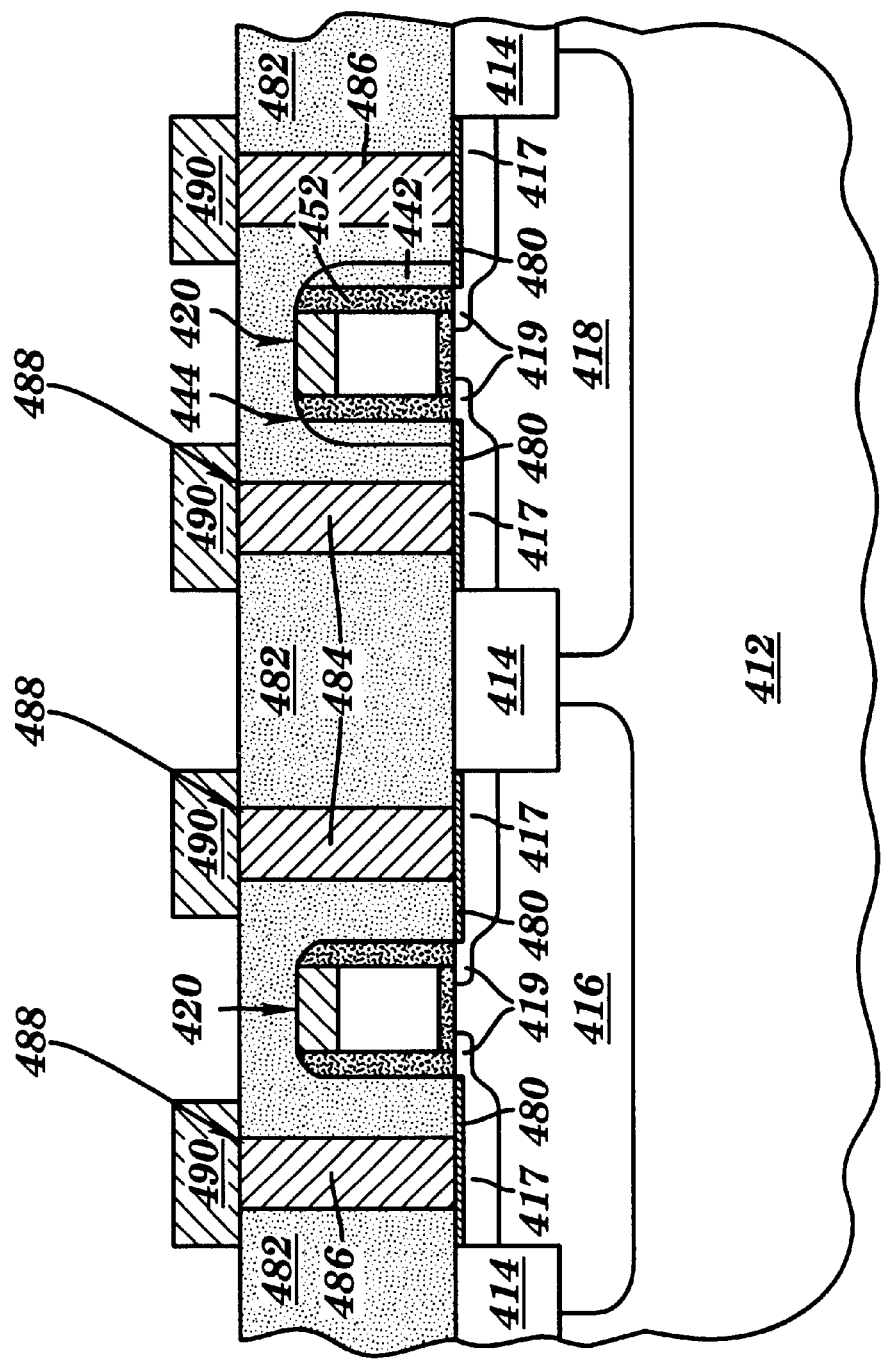
FIG. 6 shows a completed semiconductor in accordance with the present invention.

After deep SID diffusion (>$0.1\mu$) formation, as shown in FIG. 6, silicide 480 (salicide) is selectively formed over the diffusions 417, 419. The type of silicide formed may take a variety of forms, for instance, TiSi, or $CoSi_x$. Insulation material 482 is then deposited to fill the gap between and over the gate stacks 420. The insulation material 482 may also take a variety of forms, e.g., silicon dioxide or silicon nitride. A preferred material for this step being silicon dioxide.

This insulation material 482 may then be planarized by a polishing/removal, for instance, by chemical mechanical polishing (CMP). Contact holes 484 are then etched through the insulation material 482 to the S/D diffusions 417. The contact holes 484 are filled by highly conductive material 486. This material may take the form of any highly conductive material, for instance, tungsten (W), tungsten silicide (WSi$_x$), titanium silicide (TiSi$_x$), molybdenum (Mo), molybdenum silicide (MoSi$_x$), or heavily doped polysilicon. The highly conductive material 486 is then planarized, e.g., by CMP, to form a contact plug 488. Then, first level metal line 490 is formed over the contact plug 488 to wire the Field Effect Transistor (FET) device into a desired circuit (not shown).

Figure 7:
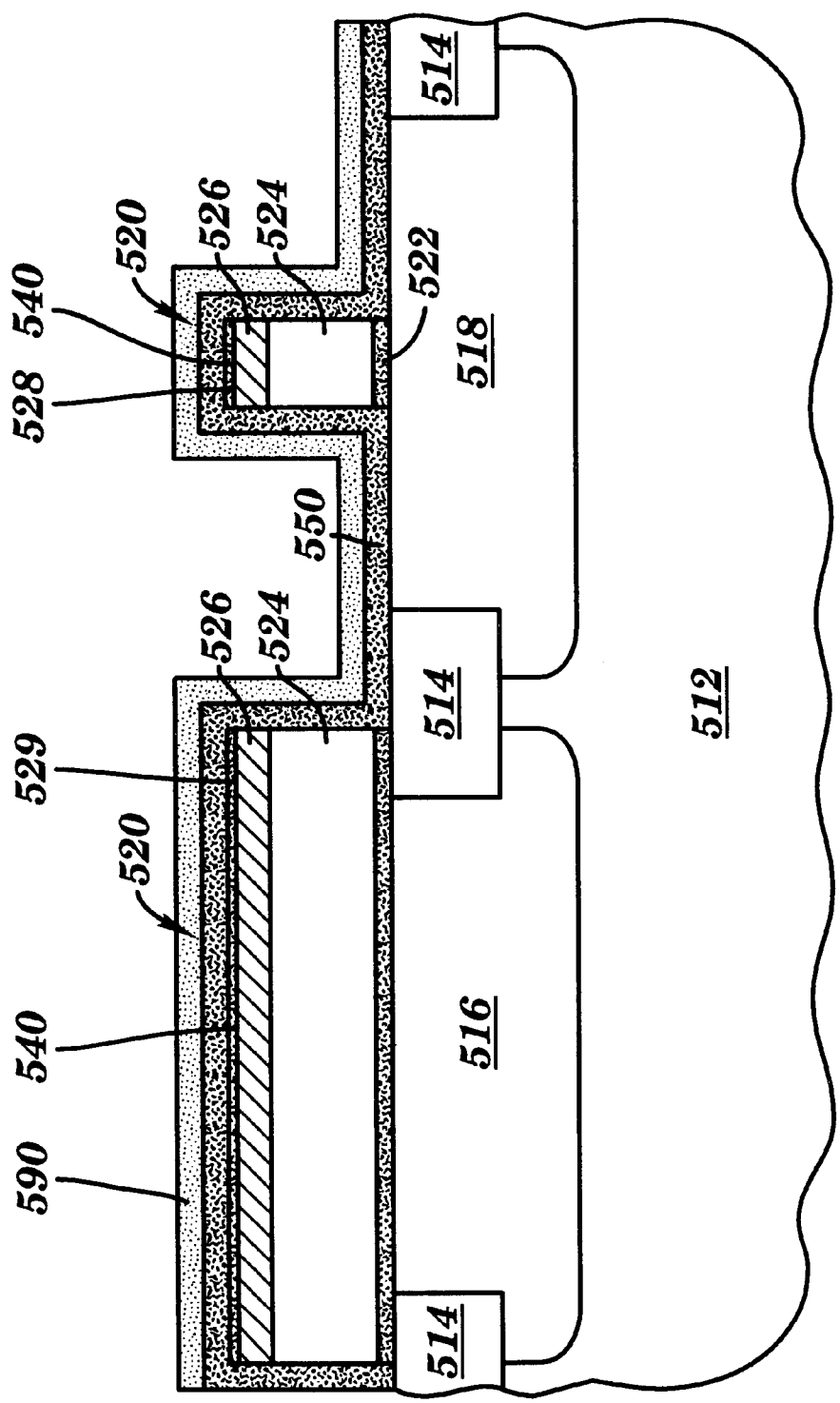
FIG. 7 shows a first step in a method of doping in accordance with a fourth embodiment of the present invention.
Figure 8:
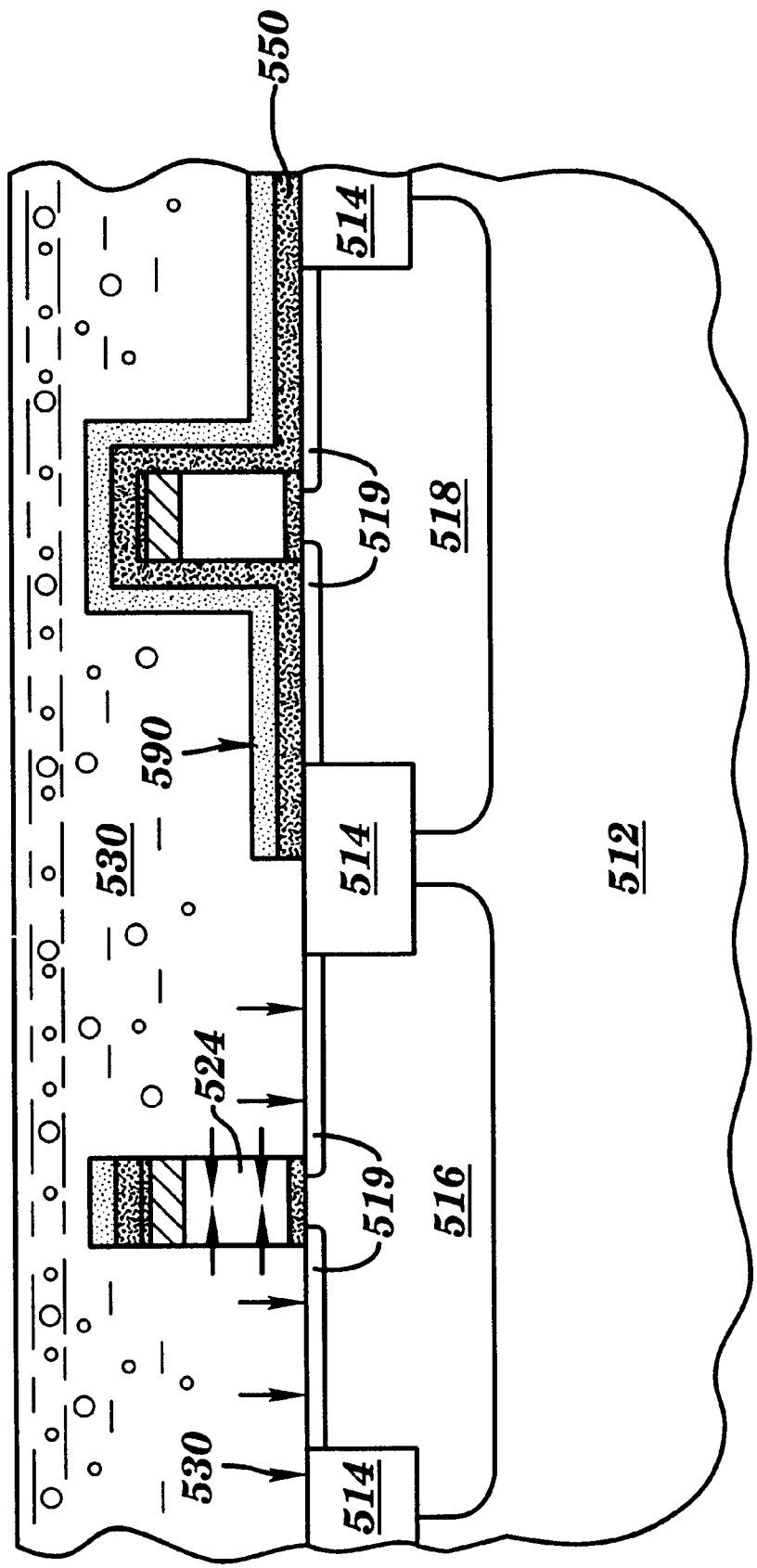
FIG. 8 shows a second step in the method of doping in accordance with the fourth embodiment of the present invention.

FIGS. 7 and 8 disclose a fourth embodiment of the present invention. Here, a gate stack 520 is formed and doped for one type of device and then a gate stack 520 of the other device type is formed and doped by the process of this embodiment. The rest of the process steps are the same as for the first embodiment described above and will not be repeated here.

After formation of the gate stacks 520, i.e., layering of gate dielectric 522, polysilicon 524, highly conductive material 526 and a diffusion preventing layer 540, the gate stacks 520 are patterned and etched only over a first well area 518, e.g., the n-well area. This leaves a defined narrow gate stack 528 and a block of undefined gate stack 529 in the region where the other type of devices are built. Next, a first type doping source material 550, e.g., a p-type dopant such as BSG, and a diffusion preventing material 590 are deposited over the entire device. Deposition may be by a variety of forms, for instance, CVD. This is followed by the driving in of the dopant by conventional heating methods.

Next, as shown in FIG. 8, the gate stack 529 over the second well area 516, e.g., the p-well area, is patterned and etched. A photoresist, not shown, may be added to cover the first well area 518. Next, the exposed gate polysilicon 524 over the second well area 516 is doped from a gas phase dopant 530 as described in the first embodiment. Alternatively, the order of the type of doping may be switched, i.e., the gate stacks over the p-well area may be first patterned and etched, and diffusion extensions and gate polysilicon may be doped from an n-type gas phase dopant. After the n-type doping of the diffusion extension and gate polysilicon, a diffusion preventing layer is deposited. Next, the gate stacks over the second well area are patterned and etched, and diffusion extensions and gate polysilicon are doped from either a gas phase dopant or a solid phase dopant. From this point, wide gate stack and deep S/D diffusion doping followed by contact hole creation and wiring may take place, as described above and not repeated here for brevity sake.

The present invention also includes the resulting semiconductor. As is evident from the discussion of the methods above, the resulting semiconductor exhibits unique structural characteristics not previously achievable. In particular, the resulting semiconductor has a narrow polysilicon gate 24, e.g., less than 0.2$\mu$, that is also highly doped completely through to the gate dielectric interface (see FIG. 1). The degree of doping or consistency of the polysilicon gate is greater than $10^{19}$ atoms of dopant/cm$^3$. Furthermore, the resulting semiconductor has very shallow S/D extensions of less than 0.1$\mu$ in depth.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims. For example in the second embodiment, the first type dopant can be done by gas phase doping or the first dopant may be an n-type dopant instead of p-type. Further, it will be understood by one having ordinary skill in the art that various modifications in the particular materials used may be made without departing from the scope of the invention.

We claim:

1. A semiconductor comprising:
   a source-drain extension area with a depth of less than 0.1 micrometers and without extra lateral scattering of dopant.

2. A semiconductor comprising:
   a gate dielectric portion characterized by substantially planar first sidewalls; and
   a polysilicon gate coupled to the gate dielectric portion at an interface, the polysilicon gate having a plurality of substantially planar second sidewalls, said second sidewalls and said first sidewalls being substantially coplanar, wherein said second sidewalls permit sufficient diffusion doping therethrough so that the polysilicon receives a resultant uniform consistency of dopant material greather than $10^{19}$ atoms of dopant material per cubic centimeter completely through to the interface with the gate dielectric portion.

3. A semiconductor comprising:
   a gate dielectric portion; and
   a polysilicon gate coupled to the gate dielectric portion at an interface, the polysilicon gate having a consistency of dopant material greater than $10^{19}$ atoms of dopant material per cubic centimeter completely through to the interface with the gate dielectric, wherein the polysilicon gate has a width of less than 0.2 micrometers.

4. A semiconductor comprising:
   a gate dielectric portion; and
   a polysilicon gate coupled to the gate dielectric portion at an interface, the polysilicon gate having a consistency of dopant material greater than $10^{19}$ atoms of dopant material per cubic centimeter completely through to the interface with the gate dielectric, wherein the semiconductor further includes a source-drain extension having a depth of less than 0.1 micrometer.

5. The semiconductor of claim 2, wherein the semiconductor further includes a conductive portion coupled to the polysilicon gate at an interface, the conductive portion having a plurality of substantially planar third sidewalls, said third sidewalls being substantially coplanar with said first sidewalls and said second sidewalls.

6. The semiconductor of claim 2, further comprising a source-drain extension area with a depth of less than approximately 0.1 micrometers.

7. The semiconductor of claim 2, wherein said polysilicon gate has a width of less than approximately 0.2 micrometers.

8. The semiconductor of claim 3, further comprising a source-drain extension area with a depth of less than approximately 0.1 micrometers.

9. The semiconductor of claim 4, wherein said polysilicon gate has a width of less than approximately 0.2 micrometers.

* * * * *